United States Patent
Ohkouchi et al.

(10) Patent No.: US 7,957,135 B2
(45) Date of Patent: Jun. 7, 2011

(54) SEMICONDUCTOR MODULE

(75) Inventors: Yasuyuki Ohkouchi, Kariya (JP); Kuniaki Mamitsu, Okazaki (JP)

(73) Assignee: Denso Corporation, Kariya (JP)

( * ) Notice: Subject to any disclaimer, the term of this patent is extended or adjusted under 35 U.S.C. 154(b) by 180 days.

(21) Appl. No.: 12/364,568

(22) Filed: Feb. 3, 2009

(65) Prior Publication Data
US 2009/0201708 A1 Aug. 13, 2009

(30) Foreign Application Priority Data
Feb. 8, 2008 (JP) .................. 2008-029417

(51) Int. Cl.
*H05K 7/20* (2006.01)
*H01L 29/00* (2006.01)

(52) U.S. Cl. ............ 361/679.54; 361/118; 361/704; 361/707; 361/715; 361/719; 165/80.3; 165/80.4; 165/104.33; 165/185; 363/34; 363/36; 363/141; 257/714; 257/718; 257/723; 318/139; 307/59; 307/60

(58) Field of Classification Search ......... 361/679.46, 361/679.53, 702–715, 69, 115, 156; 363/16, 363/17, 24, 25, 37, 97, 21.01–21.18, 56.02, 363/123, 132, 131, 65, 56.01, 95, 98, 96, 363/81, 84, 89, 126, 127, 234, 108, 144, 363/377, 147; 307/59, 60, 67, 82; 257/355, 257/356, 603, 107, 692, 705, 706, 707, 712, 257/713, 718, 735, 736, 758, 779; 318/138, 318/139, 434, 801, 811; 165/80.2, 80.3, 165/80.4, 80.5, 104.33, 104.34, 185
See application file for complete search history.

(56) References Cited

U.S. PATENT DOCUMENTS

| | | | | |
|---|---|---|---|---|
| 4,420,739 A | * | 12/1983 | Herren | 338/53 |
| 5,638,266 A | * | 6/1997 | Horie et al. | 363/132 |
| 5,767,576 A | * | 6/1998 | Kobayashi et al. | 257/701 |
| 6,072,240 A | * | 6/2000 | Kimura et al. | 257/735 |
| 6,084,771 A | * | 7/2000 | Ranchy et al. | 361/699 |
| 6,404,045 B1 | * | 6/2002 | Pelly | 257/690 |
| 6,448,645 B1 | * | 9/2002 | Kimura et al. | 257/735 |
| 6,529,062 B2 | * | 3/2003 | Majumdar et al. | 327/434 |

(Continued)

FOREIGN PATENT DOCUMENTS
DE 3540551 C * 2/1985
(Continued)

OTHER PUBLICATIONS

Japanese Office Action dated Jan. 12, 2010, issued in corresponding Japanese Application No. 2008-029417, with English translation.

*Primary Examiner* — Michael V Datskovskiy
(74) *Attorney, Agent, or Firm* — Nixon & Vanderhye P.C.

(57) ABSTRACT

A semiconductor module has switching semiconductor elements connected in parallel to each other and at least a free wheeling semiconductor element reversely connected in parallel to the switching semiconductor elements. The free wheeling semiconductor element is placed between the switching semiconductor elements. At both end parts of the semiconductor elements, each of the switching semiconductor elements is placed. A longitudinal side of each of the switching semiconductor elements and the free wheeling semiconductor element is placed in parallel to a short side of the semiconductor module. An electric-power conversion device has a plurality of arms. Each arm is composed of the semiconductor elements.

2 Claims, 8 Drawing Sheets

U.S. PATENT DOCUMENTS

| | | | |
|---|---|---|---|
| 6,693,350 B2 * | 2/2004 | Teshima et al. | 257/712 |
| 6,703,707 B1 * | 3/2004 | Mamitsu et al. | 257/718 |
| 6,750,633 B2 * | 6/2004 | Schreiber | 322/12 |
| 6,946,730 B2 * | 9/2005 | Teshima | 257/718 |
| 7,208,829 B2 * | 4/2007 | Hauenstein et al. | 257/690 |
| 7,239,016 B2 * | 7/2007 | Hirano et al. | 257/718 |
| 7,242,582 B2 * | 7/2007 | Kurauchi et al. | 361/704 |
| 7,245,493 B2 * | 7/2007 | Inagaki et al. | 361/699 |
| 7,423,894 B2 * | 9/2008 | Ilic | 363/132 |
| 7,456,492 B2 * | 11/2008 | Mochida | 257/659 |
| 7,619,302 B2 * | 11/2009 | Hauenstein | 257/666 |
| 7,642,640 B2 * | 1/2010 | Shinohara | 257/699 |
| 7,724,523 B2 * | 5/2010 | Ishiyama | 361/699 |
| 7,755,187 B2 * | 7/2010 | Shiraki et al. | 257/723 |
| 7,800,222 B2 * | 9/2010 | Schulz et al. | 257/723 |

FOREIGN PATENT DOCUMENTS

| | | |
|---|---|---|
| JP | 10-056029 | 2/1998 |
| JP | 11-103012 | 4/1999 |
| JP | 2001-308237 | 11/2001 |
| JP | 2003/007969 | 1/2003 |

* cited by examiner (COMPARISON EXAMPLE)

SEMICONDUCTOR MODULE

CROSS-REFERENCE TO RELATED APPLICATION

This application is related to and claims priority from Japanese Patent Application No. 2008-029417 filed on Feb. 8, 2008, the contents of which are hereby incorporated by reference.

BACKGROUND OF THE INVENTION

1. Field of the Invention

The present invention relates to semiconductor modules comprised of a plurality of switching semiconductor elements such as insulated gate bipolar transistors (IGBT) connected in parallel and at least a free wheeling semiconductor element such as a free wheeling diode (FWD) which is reversely connected in parallel to the plurality of switching elements.

2. Description of the Related Art

Hybrid vehicles and electric vehicles are equipped with a high electric-power conversion device in order to convert electric power between AC and DC power. In general, a hybrid vehicle uses two or more distinct power sources such as an internal combustion engine and an electric motor to drive the vehicle. On the other hand, an electric vehicle uses an electric motor to propel the vehicle.

FIG. 7 is a circuit diagram of a conventional electric-power conversion device 74 having a plurality of semiconductor modules 9. As shown in FIG. 7, the electric-power conversion device 74 capable of performing the conversion of high electric-power is comprised of a booster converter 741 and an inverter 742 which are placed between a DC power source 401 and a three phase AC electric motor 402. When the booster converter 741 boosts DC power supplied from the DC power source 401, the inverter 742 converts DC power to AC power, and then supplies converted AC power to the three phase AC electric motor 402.

On the other hand, during regeneration cycle, the inverter 742 converts AC power regenerated by the three phase AC electric motor 402 to DC power. The booster converter 741 steps down the converted DC power and supplies the DC power to the DC power source 401.

As shown in FIG. 7, the inverter 742 is comprised of six arms. Each arm has semiconductor elements 92 and 93 which are comprised of an insulated gate bipolar transistor (IGBT) and the like. In the inverter 742, the two arms forming a pair are connected in series. Thus, the two arms connected in series form a pair. The upper side arm 721 in each pair is electrically connected to a positive (+) electrode terminal of the DC power source 401, and the bottom side arm 722 is electrically connected to a negative (−) electrode terminal of the DC power source 401. As shown in FIG. 7, the upper arm 721 and the bottom arm 722 connected in series form a DC circuit. Total three DC circuits are placed in the inverter 742. A connection node between the upper arm 721 and the bottom arm 722 in each pair (as each DC circuit) is electrically connected to one of the U-phase electrode, the V-phase electrode, and the W-phase electrode of the three phase AC electric motor 402. That is, as shown in FIG. 7, the three connection nodes of the upper arms 721 and the bottom arms 722 in the three pairs are connected to the U-phase electrode, the V-phase electrode, and the W-phase electrode of the three phase AC electric motor 402, respectively.

The booster converter 741 is comprised of an upper arm 711 and a bottom arm 712 connected in series, and a reactor 413. The reactor 413 is connected between the connection node between the upper arm 711 and the bottom arm 712 and the positive (+) electrode terminal of the DC power source 401. Each arm in the booster converter 741 and the inverter 742 is comprised of the switching semiconductor element 92 and the free wheeling semiconductor element 93. The switching semiconductor element 92 and the free wheeling semiconductor element 93 are connected in parallel.

FIG. 8 is a perspective view of the conventional semiconductor module 9 to be placed in the conventional electric-power conversion device shown in FIG. 7.

As shown in FIG. 8, each arm is comprised of a single semiconductor module 9 in which the switching semiconductor element 92 and the free wheeling semiconductor element 93 are assembled together in a single module. For example, Japanese patent laid open publication No. JP 2001-308237 has disclosed such a conventional semiconductor module 9 which forms one arm.

However, because the built-in electric motor in vehicles such as hybrid vehicles need a large current, such a large current flows in each arm of the electric-power conversion device 74 incorporated in the vehicles.

FIG. 9 is a circuit diagram showing another structure of the semiconductor modules placed in the conventional electric-power conversion device. FIG. 10 is a plan view of another structure of the conventional semiconductor modules placed in the conventional electric-power conversion device.

As shown in FIG. 9, each of upper and bottom arms 911 and 912 in a booster converter 941 and upper and bottom arms 921 and 922 in an inverter 942 is comprised of a plurality of the semiconductor modules 9 connected in parallel in order to divide a large current.

However, as shown in FIG. 10, each arm is comprised of a plurality of the semiconductor modules 9 connected in parallel. This structure shown in FIG. 10 increases the total number of the semiconductor modules 9. This structure causes an increase in the entire size of the electric-power conversion device 94. That is, for example, when each arm is comprised of two semiconductor modules 9, the total number of the semiconductor modules 9 in the electric-power conversion device 94 becomes doubled. Because the electric-power conversion device 94 is comprised of the semiconductor modules 9 and cooling pipes 5, and those are laminated toward its lamination direction shown in FIG. 10, the total size of the electric-power conversion device 94 becomes doubled in area observed from its lamination direction.

In order to avoid such a conventional problem, there is a possibility of forming a single semiconductor module comprised of the two semiconductor modules 9. That is, a plurality of the switching semiconductor elements 92 connected in parallel and a plurality of the free wheeling semiconductor elements 93 connected in parallel are assembled together in a single semiconductor module.

However, when the switching semiconductor elements 92 are placed close to each other in the semiconductor modules 9, the current simultaneously flows in the switching semiconductor elements 92, and heat energy is simultaneously generated in the switching semiconductor elements 92. The heat energy rapidly increases the temperature of the semiconductor modules 9.

In order to avoid such a conventional problem, Japanese patent laid open publication No. JP H11-103012 has disclosed a unique structure to alternately place the switching semiconductor elements 92 and the free wheeling semiconductor elements 93 in the semiconductor modules so that the switching semiconductor elements 92 are not adjacent to each other.

In general, during the power running operation of the electric power conversion device 94 in which DC power is converted to AC power, the current mainly flows in the switching semiconductor elements 92. On the other hand, during the electric power regeneration operation of the electric power conversion device in which AC power is converted to DC power, the current mainly flows through the free wheeling semiconductor elements 93.

Further, the total heat energy generated in the switching semiconductor elements 92 during the power running operation is in general larger than that in the free wheeling semiconductor elements 93 during the electric power regeneration operation. During the power running operation, a current of a certain amount flows in the switching semiconductor elements 92. Still further, during the power running operation, the amount of current flowing in the switching semiconductor elements 92 tends to be larger than that in the free wheeling semiconductor elements 93. That is, it may be said that the switching semiconductor elements 92 generate a large amount of heat energy rather than the free wheeling semiconductor elements 93 not only in the power running operation but also in the electric power regeneration operation.

From such a point of view, it is preferable that the switching semiconductor elements 92 are placed at both end parts of the semiconductor modules 9, namely, the switching semiconductor element 92 is not placed between the free wheeling semiconductor elements 93 in order to eliminate the influence of the generated heat energy.

On the other hand, in the structure disclosed in Japanese patent laid open publication No. JP H11-103012, the free wheeling semiconductor element 93 is placed at one end of the arrangement of the switching semiconductor element 92 and the free wheeling semiconductor element 93. The switching semiconductor element 92 is placed between the free wheeling semiconductor elements 93. It cannot be always said that this structure disclosed in JP H11-103012 adequately radiates the heat energy generated in the switching semiconductor elements 92.

SUMMARY OF THE INVENTION

It is an object of the present invention to provide a semiconductor module having a superior heat radiating function with compact size. The semiconductor module is for example applied to an electric-power conversion device mounted to vehicles such as hybrid vehicles and other devices.

To achieve the above purposes, the present invention provides a semiconductor module having a plurality of switching semiconductor elements arranged in parallel to each other and at least a free wheeling semiconductor element reversely arranged in parallel to the switching semiconductor elements. In the semiconductor module according to the present invention, the free wheeling semiconductor element is placed between the switching semiconductor elements, and the switching semiconductor elements are placed at both end parts of the arrangement of the free wheeling semiconductor element and the switching semiconductor elements.

The switching semiconductor elements and the free wheeling semiconductor element are built in the semiconductor module according to the present invention. The switching semiconductor elements are connected in parallel to each other. An electric-power conversion device is comprised of a plurality of arms. Each arm is comprised of at least three semiconductor modules according to the present invention. For example, each arm is comprised of a pair of the switching semiconductor elements and the free wheeling semiconductor element. This structure can reduce the total number of the components forming the semiconductor module when compared with the structure of a conventional semiconductor module, and thereby reduce the entire size of the semiconductor module.

The semiconductor module according to the present invention has the structure in which the free wheeling semiconductor element is placed between the switching semiconductor elements. That is, the switching semiconductor elements connected in parallel are placed not to be adjacent to each other in the semiconductor module.

In this arrangement of the semiconductor elements, the elements in the semiconductor module are influenced with each other. This thereby suppresses the temperature rise of each switching semiconductor element.

Further, because each switching semiconductor element is placed at both end parts of the arrangement of the semiconductor elements, namely, because the semiconductor module does not have any structure in which each switching semiconductor element is placed between the free wheeling semiconductor elements, it is possible to efficiently radiate the heat generated in the switching semiconductor elements to the outside atmosphere of the semiconductor module. As a result, this can suppress the temperature rise of the whole of the semiconductor module.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
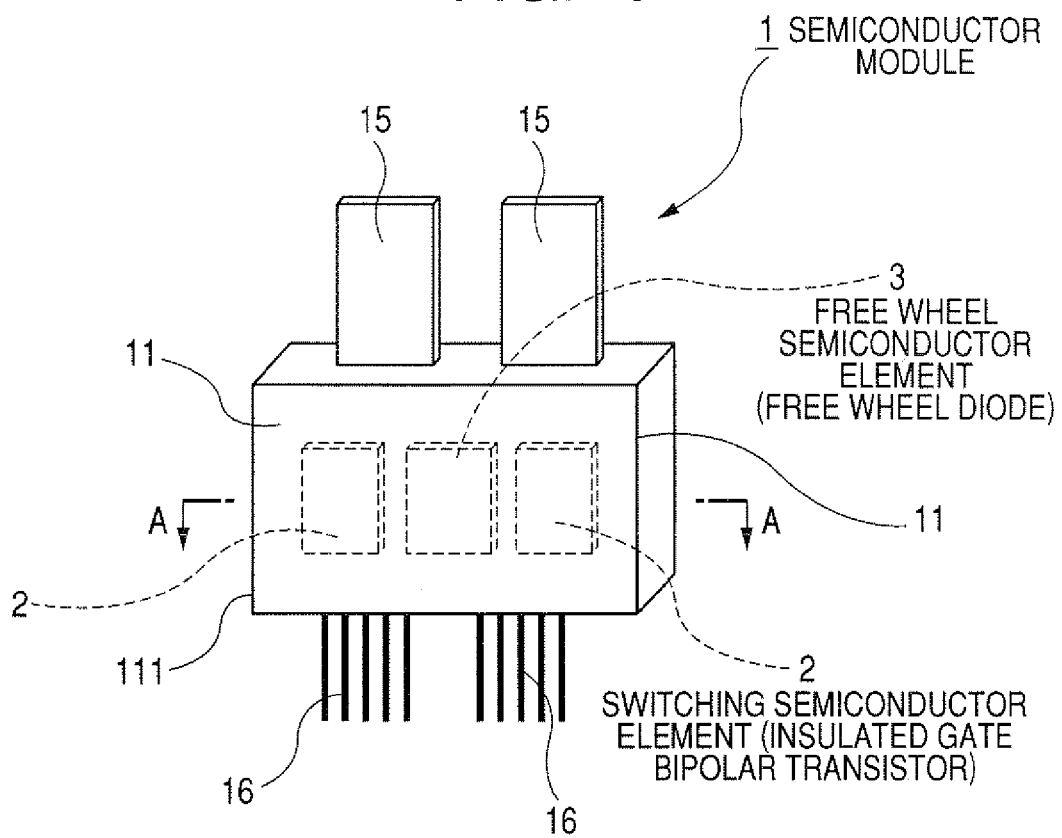
FIG. 1 is a perspective view of a semiconductor module, to be built in an electric-power conversion device, according to a first embodiment of the present invention.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of the semiconductor module to be built in an electric-power conversion device with reference to FIG. 1 to FIG. 4. For example, the electric-power conversion device is mounted to hybrid vehicles and others.

FIG. 1 is a perspective view of a semiconductor module according to a first embodiment of the present invention. As shown in FIG. 1, the semiconductor module 1 according to the first embodiment is comprised of a pair of switching semiconductor elements 2 and at least a free wheeling semiconductor element 3. The switching semiconductor elements 2 are connected in parallel. The free wheeling semiconductor element 3 is reversely connected in parallel to the pair of switching semiconductor elements 2. The free wheeling semiconductor element 3 is placed between the pair of switching semiconductor elements 2. Thus, the switching semiconductor elements 2 are placed at both end parts of the semiconductor module 1, and the free wheeling semiconductor element 3 is placed at the central part of the semiconductor module 1.

The semiconductor module 1 has a main body part 11 of a rectangle shape in which a pair of the switching semiconductor elements 2 and the free wheeling semiconductor element 3 are incorporated. In the semiconductor module 1 of the first embodiment, the longitudinal part of each of the switching semiconductor elements 2 and the free wheeling semiconductor element 3 is placed in parallel to the short side 111 of the semiconductor module 1 of a rectangle shape.

The first embodiment uses an insulated gate bipolar transistor (IGBT) as the switching semiconductor element 2, and uses a free wheeling diode (FWD) as the free wheeling semiconductor element 3.

Figure 2:
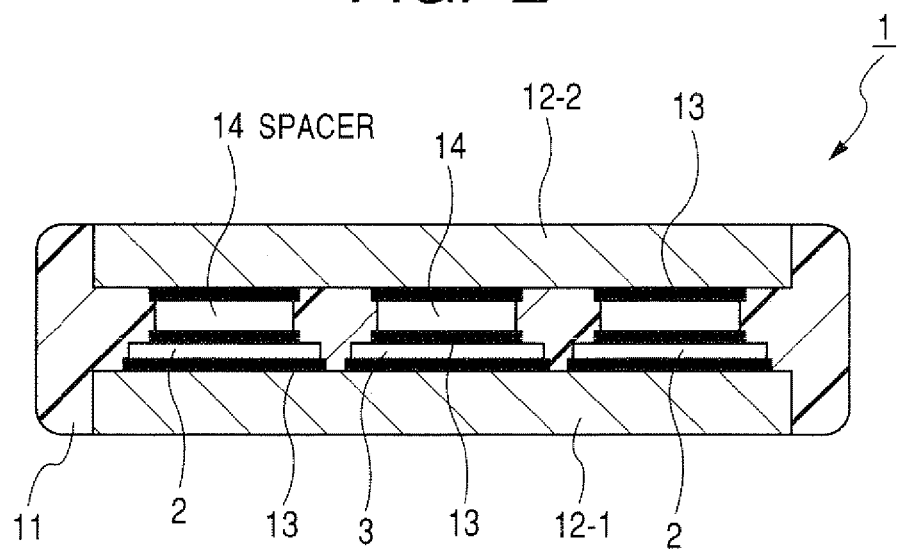
FIG. 2 is a cross section of the semiconductor module along the A-A line shown in FIG. 1.

FIG. 2 is a cross section of the semiconductor module 1 along the A-A line shown in FIG. 1. As shown in FIG. 2, the semiconductor module 1 is comprised of the switching semiconductor elements 2, the free wheeling semiconductor element 3, and the pair of radiating plates 12-1 and 12-2. That is, the switching semiconductor elements 2 and the free wheeling semiconductor element 3 are placed between the radiating plates 12-1 and 12-2.

One radiating plates 12-1 is fixedly placed onto one surface side of each of the switching semiconductor elements 2 and the free wheeling semiconductor element 3 by solder 13 designated with the black bold line shown in FIG. 2. The other radiating plate 12-2 is fixedly placed onto the other surface side of each of the switching semiconductor elements 2 and the free wheeling semiconductor element 3 through spacers 14 by solder 13. That is, the spacer 14 and the radiating plate 12-2 are fixed together by solder 13 designated by black bold lines shown in FIG. 2, and the spacer 14 and the semiconductor elements 2 and 3 are fixed together by solder 13.

The pair of the radiating plates 12-1 and 12-2 is electrically connected to the pair of electrode terminals 15, respectively. The radiating plates 12-1 and 12-2 are exposed on the surfaces of the semiconductor module 1. The electrode terminals 15 are projected from the one surface of the main body part of the semiconductor module 1 along the direction which is perpendicular to the arrangement direction of the switching semiconductor elements 2 and the free wheeling semiconductor element 3.

Signal terminals 16 are projected from the opposite surface of the main body part of the semiconductor module 1. The signal terminals 16 are connected to the base terminals of the switching semiconductor elements in the semiconductor module 1, for example. The signal terminals 16 are connected to a control circuit (not shown) to control the operation of each arm.

As shown in FIG. 1, each semiconductor module 1 according to the first embodiment has the ten signal terminals 16 which are divided to the pair of terminal groups. Each terminal group has the five signal terminals 16. For example, the two signal terminals 16 in each terminal group are connected to the gates of the two IGBTs (as the switching semiconductor elements) in each arm. The remaining signal terminals 16 in the arm are connected to a terminal of a temperature sensing diode (not shown), and the like. Through the signal terminals 16, the control circuit (not shown) controls the operation of the two IGBTs 2 and the FWD 3 (as the free wheeling semiconductor element) in each arm.

Figure 3:
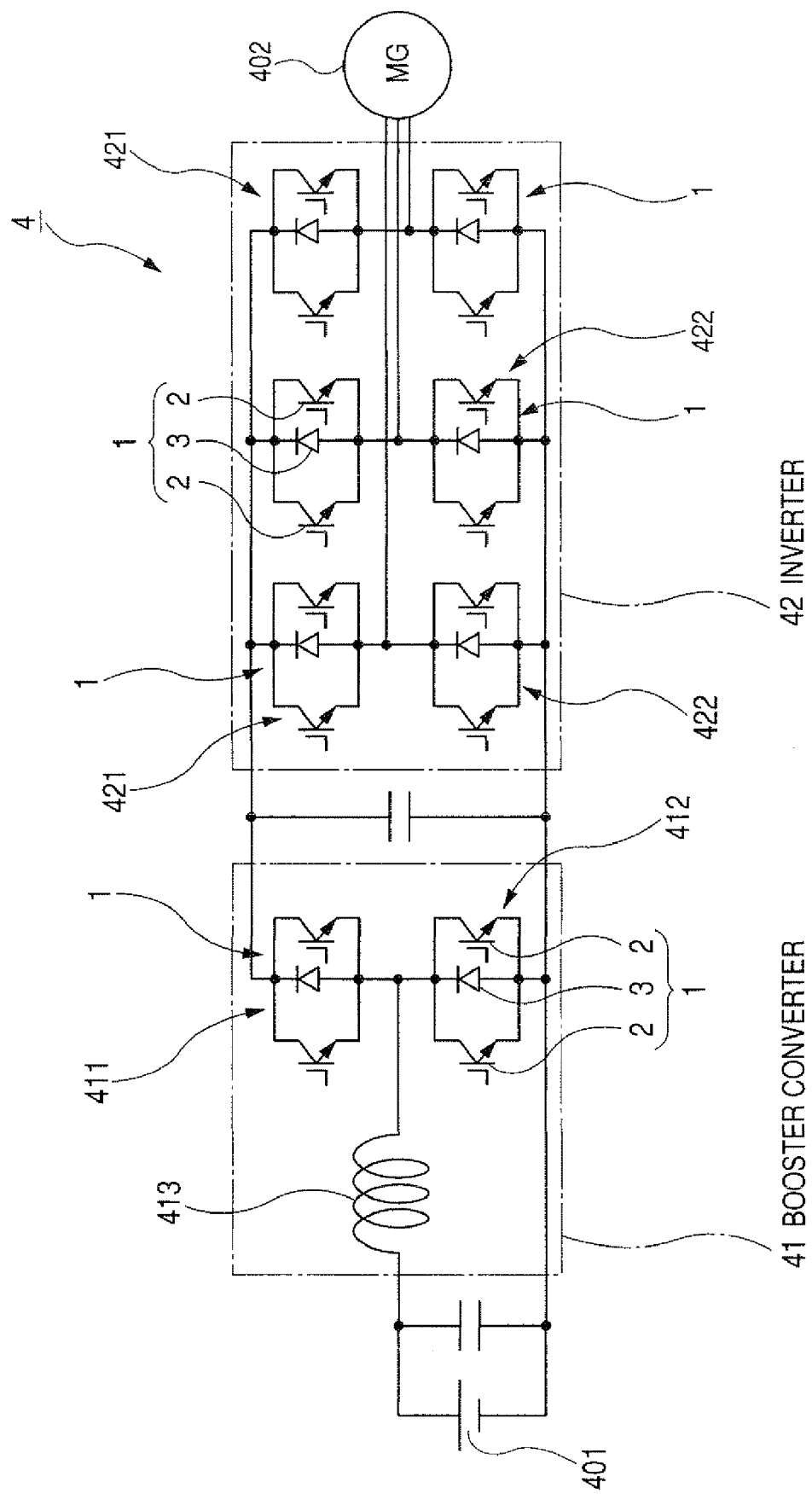
FIG. 3 is a circuit diagram of the electric-power conversion device equipped with a plurality of the semiconductor modules according to the first embodiment of the present invention.

FIG. 3 is a circuit diagram of an electric-power conversion device having a plurality of the semiconductor modules 1 according to the first embodiment of the present invention.

The semiconductor module 1 according to the first embodiment of the present invention is used as a switching part into the electric-power conversion device 4 shown in FIG. 3.

As shown in FIG. 3, the electric-power conversion device 4 is comprised of a booster converter 41 and an inverter 42 which are placed between a DC power source 401 and a three phase AC electric motor 402.

After the booster converter 41 boosts DC power supplied from the DC power source 401, the inverter 42 converts DC power to AC power, and then supplies the converted AC power to the three phase AC electric motor 402.

On the other hand, the inverter 42 converts AC power regenerated by the three phase AC electric motor 402 to DC power. The booster converter 41 steps down the converted DC power, and supplies the DC power to the DC power source 401.

As clearly shown in FIG. 3, the inverter 42 in the electric-power conversion device 4 is comprised of six arms. Each arm is comprised of an upper arm 421 and a bottom arm 422. Each of the upper arm 421 and the bottom arm 422 is comprised of the two switching semiconductor elements 2 and the free wheeling semiconductor element 3. The two arms are connected in series. One arm 422 (or the upper arm 422) in a pair of the arms connected in series is electrically connected to the positive (+) electrode side of the DC power source 401. The other arm 422 (or the bottom arm 422) is electrically connected to the negative (−) electrode of the DC power source 401.

The three pairs of the upper arm 421 and the bottom arm 422 connected in series are placed in the inverter 42. The connection node between the upper arm 421 and the bottom arm 422 in each pair is electrically connected to U-phase electrode, V-phase electrode, and W-phase electrode of the three phase AC electric motor 402, respectively.

As shown in FIG. 3, the booster converter 41 in the electric-power conversion device 4 is comprised of the upper arm 411, the bottom arm 412, and a reactor 413. The reactor 413 is connected between the positive (+) electrode of the DC power source 41 and the connection node between the upper arm 411 and the bottom arm 412.

Each arm (each of the upper arms 411, 421 and the bottom arms 412 and 422) in the booster converter 41 and the inverter 42 is comprised of the pair of the switching semiconductor elements 2 and the free wheeling semiconductor element 3. The switching semiconductor elements 2 are connected in parallel to each other. The free wheeling semiconductor element 3 is reversely connected in parallel to the switching semiconductor elements 2.

That is, the semiconductor module 1 according to the first embodiment is comprised of the pair of the switching semiconductor elements 2 and the free wheeling semiconductor element 3. Those switching semiconductor elements 2 and the free wheeling semiconductor element 3 are built in together to make the semiconductor module 1. Each semiconductor module 1 corresponds to each arm in the electric power conversion device 4.

In each arm, namely, in each semiconductor module 1, the collector terminals of the two switching semiconductor elements 2 are connected to each other, and the emitter terminals of them are connected to each other. The anode terminal of the free wheeling semiconductor element 3 is connected to the emitter terminals of the switching semiconductor element 2. The cathode terminal of the free wheeling semiconductor element 3 is connected to the collector terminals of the switching semiconductor elements 2. The base terminals of the two switching semiconductor elements 2 are connected to the signal terminals 16 shown in FIG. 1.

In the booster converter 4L during the boosting operation, the pair of the switching semiconductor elements 2 in the upper arm 411 is turned off, and the pair of the switching semiconductor elements 2 in the bottom arm 412 is turned on and off. This operation allows the current to flow through the free wheeling semiconductor element 3 in the upper arm 411 and through the switching semiconductor elements 2 in the bottom arm 412. As a result, those semiconductor elements generate heat.

On the other hand, in the booster converter 41 during the voltage step-down operation, the pair of the switching semiconductor elements 2 in the upper arm 411 is turned on and off, and the switching semiconductor elements 2 in the bottom arm 421 are turned off. This operation allows the current to flow through the switching semiconductor elements 2 in the upper arm 411 and through the free wheeling semiconductor element 3 in the bottom arm 412. As a result, those semiconductor elements generate heat.

In the inverter 42 during the power running operation, the switching semiconductor elements 2 in each arm is turned on and off. This operation allows the current to mainly flow through the switching semiconductor elements 2. As a result, the switching semiconductor elements 2 mainly generate heat.

On the other hand, during the power regeneration operation, although the switching semiconductor elements 2 in each arm are turned on and of, the current mainly flows through the free wheeling semiconductor element 3. This operation allows the free wheeling semiconductor element 3 to mainly generate heat.

As described above, during the boosting operation, the step-down operation, the power running operation, and the power regeneration operation, the switching semiconductor elements 2 or the free wheeling semiconductor element 3 generate heat. In particular, the pair of the switching semiconductor elements 2 in each arm connected in parallel generates heat simultaneously.

However, during the boosting operation, any free wheeling semiconductor element 3 in the semiconductor module 1 as the bottom arm 412 does not generate heat. During the step-down operation, the free wheeling semiconductor element 3 in the semiconductor module 1 as the upper arm 411 does not generate heat.

Further, during the power running operation, both the switching semiconductor elements 2 and the free wheeling semiconductor element 3 generate heat. In general, during the power running operation, the heat energy of the free wheeling semiconductor element 3 is adequately smaller than that of the switching semiconductor element 2.

On the other hand, during the power regeneration operation, both the switching semiconductor elements 2 and the free wheeling semiconductor element 3 generate heat. In general, during the power regeneration operation, the heat energy of the switching semiconductor elements 2 is slightly smaller than or equal to that of the free wheeling semiconductor element 3.

In general terms, it is therefore understood that the switching semiconductor element 2 generates heat rather than the free wheeling semiconductor element 3.

Figure 4:
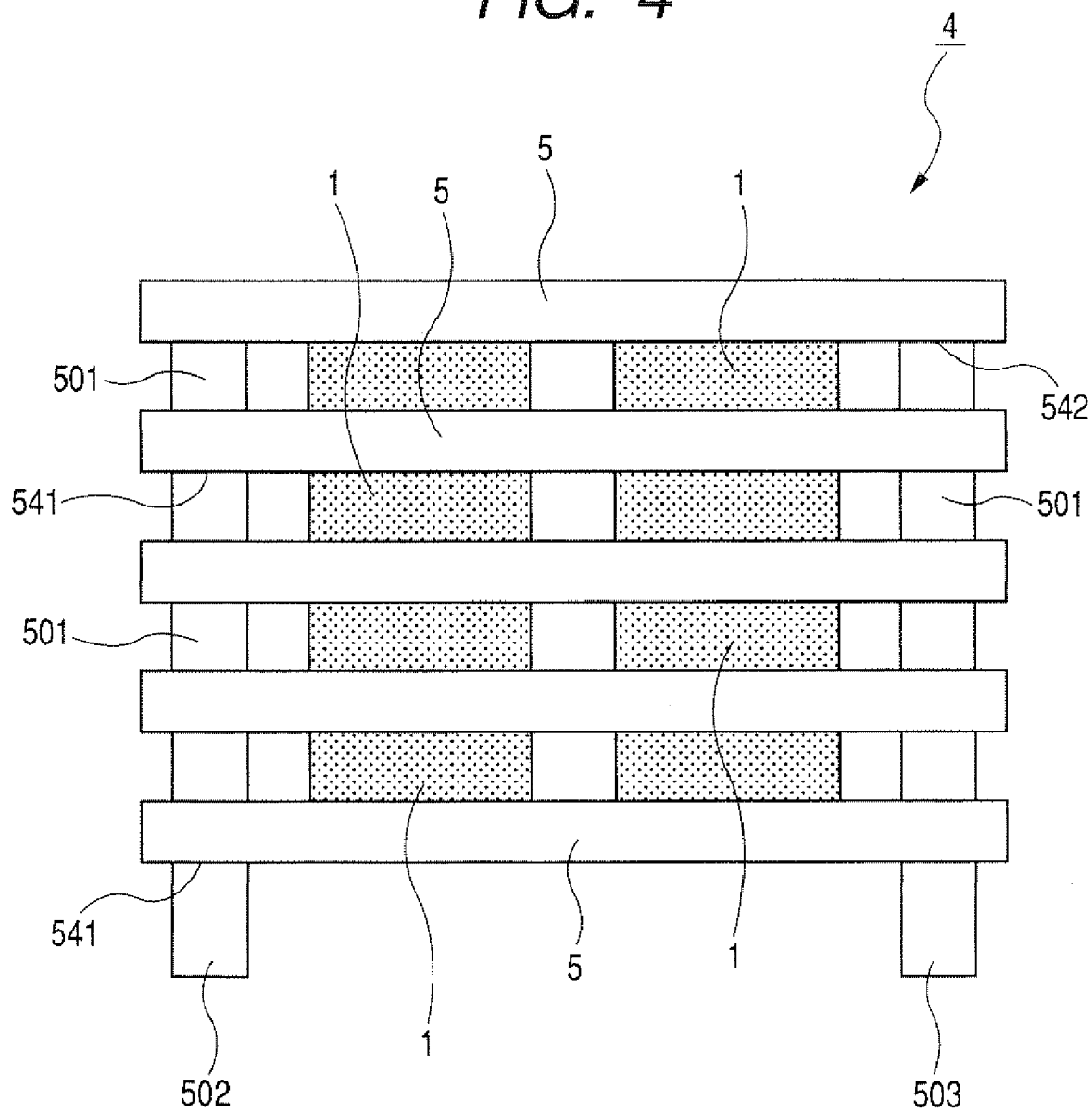
FIG. 4 is a plan view of the electric-power conversion device equipped with a plurality of the semiconductor modules according to the first embodiment of the present invention.

FIG. 4 is a plan view of the electric-power conversion device using the semiconductor modules 1 according to the first embodiment of the present invention.

As shown in FIG. 4, cooling pipes 5 are fixedly adhered on both the surfaces of each semiconductor module 1. A coolant medium flows in the cooling pipes 5 in order to cool the semiconductor modules 1 in the electric-power conversion device.

An insulation material having superior conductivity is placed between the semiconductor modules and the cooling pipes 5.

A pair of the semiconductor modules 1, which form the upper arm and the bottom arm connected in series, is placed between a pair of the cooling pipes 5.

Each cooling pipe 5 is made of metal having superior heat conductivity such as aluminum. At both ends of the cooling pipe 5, a cooling medium inlet 541 is formed at one end of the cooling pipe 5, and a cooling medium outlet 542 is formed at the other end of the cooling pipe 5.

As shown in FIG. 4, the cooling pipes 5 are placed with a predetermined interval in the lamination direction thereof. The cooling medium inlets 541 and the cooling medium outlet 542 of the cooling pipes 5 adjacent to each other are communicated together through a connection pipe 501. Between the adjacent cooling pipes 5, the semiconductor modules 1 are placed. Both the surfaces of each semiconductor module 1 are adhered to the cooling pipes 5.

A cooling medium introduction pipe 502 and a cooling medium drain pipe 503 are placed in the cooling pipe 5 placed at one end of the lamination direction described above. The cooling medium is introduced into the inside of the cooling pipes 5 through the cooling medium introduction pipe 502. The cooling medium is discharged from the cooling pipes 5 through the cooling medium drain pipe 503.

The cooling medium introduced into the cooling pipes 5 through the cooling medium introduction pipe 502 flows through each of the cooling pipes, and is finally discharged through the cooling medium drain pipe 503 to the outside. During the flow of the cooling medium through each cooling pipe 5, the heat exchange is performed between the cooling medium and the semiconductor modules 5. That is, the cooling medium receives the heat energy of the semiconductor modules 5. As a result, this prevents the temperature rise of the semiconductor modules 1 in the electric-power conversion device. The cooling medium of a high temperature after the heat exchange is drained through the cooling medium drain pipe 503.

Next, a description will now be given of the operation of the semiconductor module 1 according to the first embodiment of the present invention.

Each semiconductor module 1 has a plurality of the built-in switching semiconductor elements 2 which are connected in parallel. This structure of the semiconductor module 1 can reduce the entire size of the semiconductor module when the semiconductor modules 1 are assembled in the electric-power conversion device.

Further, the free wheeling semiconductor element 3 is placed between the pair of the switching semiconductor elements 2 in each semiconductor module 1. That is, the switching semiconductor elements 2 connected in parallel are not adjacent to each other because of the sandwiching of the free wheeling semiconductor device 3 between the switching semiconductor elements 2. It is thereby possible to suppress any temperature rise of a plurality of the switching semiconductor elements 2 by influence to each other.

Still further, the switching semiconductor element 2 is placed at each end part of the semiconductor module 1 observed from the arrangement direction of the switching semiconductor elements 2 and the free wheeling semiconductor element 3. This structure of the semiconductor element 1 according to the first embodiment does not sandwich any switching semiconductor element 2 between the free wheeling semiconductor elements 3. This structure of the semiconductor element 1 of the first embodiment efficiently radiates the heat energy generated in the switching semiconductor elements 2 to the outside, for example, through the cooling pipes 5. As a result, the entire of the semiconductor element 1 of the first embodiment can suppress the temperature rise.

Each semiconductor module 1 according to the first embodiment of the present invention is comprised of the switching semiconductor elements 2 and the free wheeling semiconductor element 3. As clearly shown in FIG. 3, each arm has one free wheeling semiconductor element 3. This structure of the semiconductor module 1 can reduce the entire size thereof.

Further, as shown in FIG. 1, the longitudinal direction of each of the switching semiconductor elements 2 and the free wheeling semiconductor element 3 is placed or arranged in parallel to the short side 111 of the semiconductor module 1 according to the first embodiment of the present invention. This structure of the semiconductor module 1 according to the first embodiment can avoid the semiconductor module 1 increasing in length along its longitudinal direction. Therefore this structure allows the semiconductor module 1 to have a small size.

As described above in detail, according to the first embodiment of the present invention, it is possible to provide the semiconductor module having a superior heat discharging function with a small size.

Second Embodiment

A description will be given of a semiconductor module 1-1 equipped with a plurality of free wheeling semiconductor elements 3 according to the second embodiment of the present invention with reference to FIG. 5.

Figure 5:
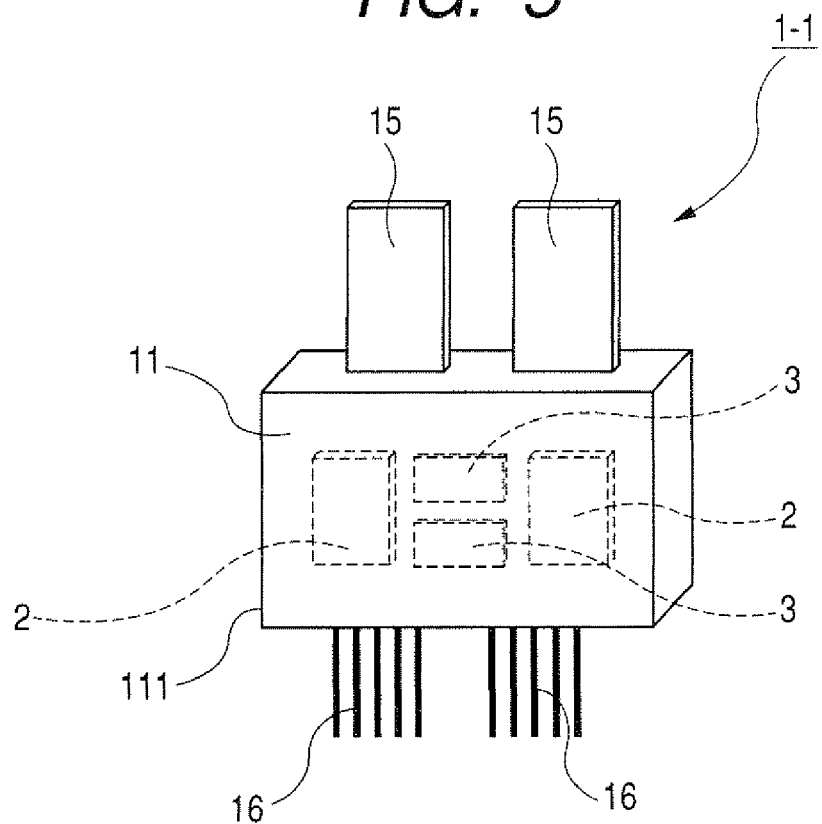
FIG. 5 is a perspective view of a semiconductor module according to a second embodiment of the present invention.

FIG. 5 is a perspective view of the semiconductor module 1-1 according to the second embodiment of the present invention.

As shown in FIG. 5, a pair of the switching semiconductor elements 2 is placed at both the ends of the semiconductor module 1-1, like the structure of the semiconductor module 1 shown in FIG. 1. Further, the pair of the free wheeling semiconductor elements 3 is placed between the switching semiconductor elements 2. The free wheeling semiconductor elements 3 are arranged in the direction in parallel to the short side 111 of the semiconductor module 1-1. The longitudinal part of each of the switching semiconductor elements 2 is placed in parallel to the short side of the semiconductor module 1-1. Other components of the semiconductor module 1-1 according to the second embodiment are the same as those of the semiconductor module 1 according to the first embodiment.

Because the semiconductor module 1-1 according to the second embodiment has the two built-in free wheeling semiconductor elements 3, it is possible to suppress the temperature rise of the free wheeling semiconductor elements 3, and thereby possible to enhance the radiating function of the semiconductor module 1-1.

In particular, the longitudinal part of each of the switching semiconductor elements 2 is placed in parallel to the short side 111 of the semiconductor module 1-1, and the plurality of the free wheeling semiconductor elements 3 are arranged along the direction in parallel to the short side 111 of the semiconductor module 1-1. It is therefore possible to suppress increasing of the longitudinal part of the semiconductor module 1-1, and to provide the semiconductor module 1-1 with short size.

Other actions and effects of the semiconductor module 1-1 according to the second embodiment are the same as those of the semiconductor module 1 according to the first embodiment.

COMPARISON EXAMPLE

A description will now be given of the comparison example with reference to FIG. 6.

Figure 6:
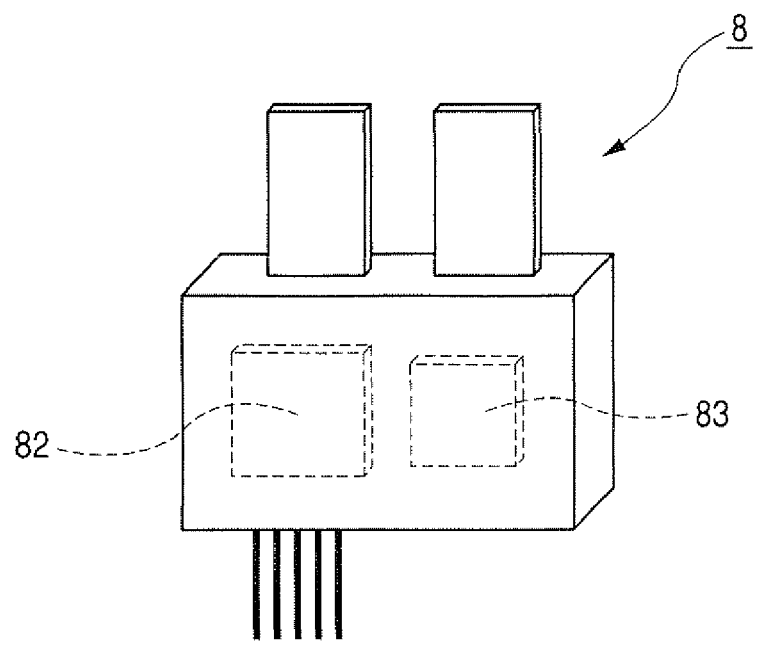
FIG. 6 is a perspective view of a semiconductor module as a comparison example.
Figure 7:
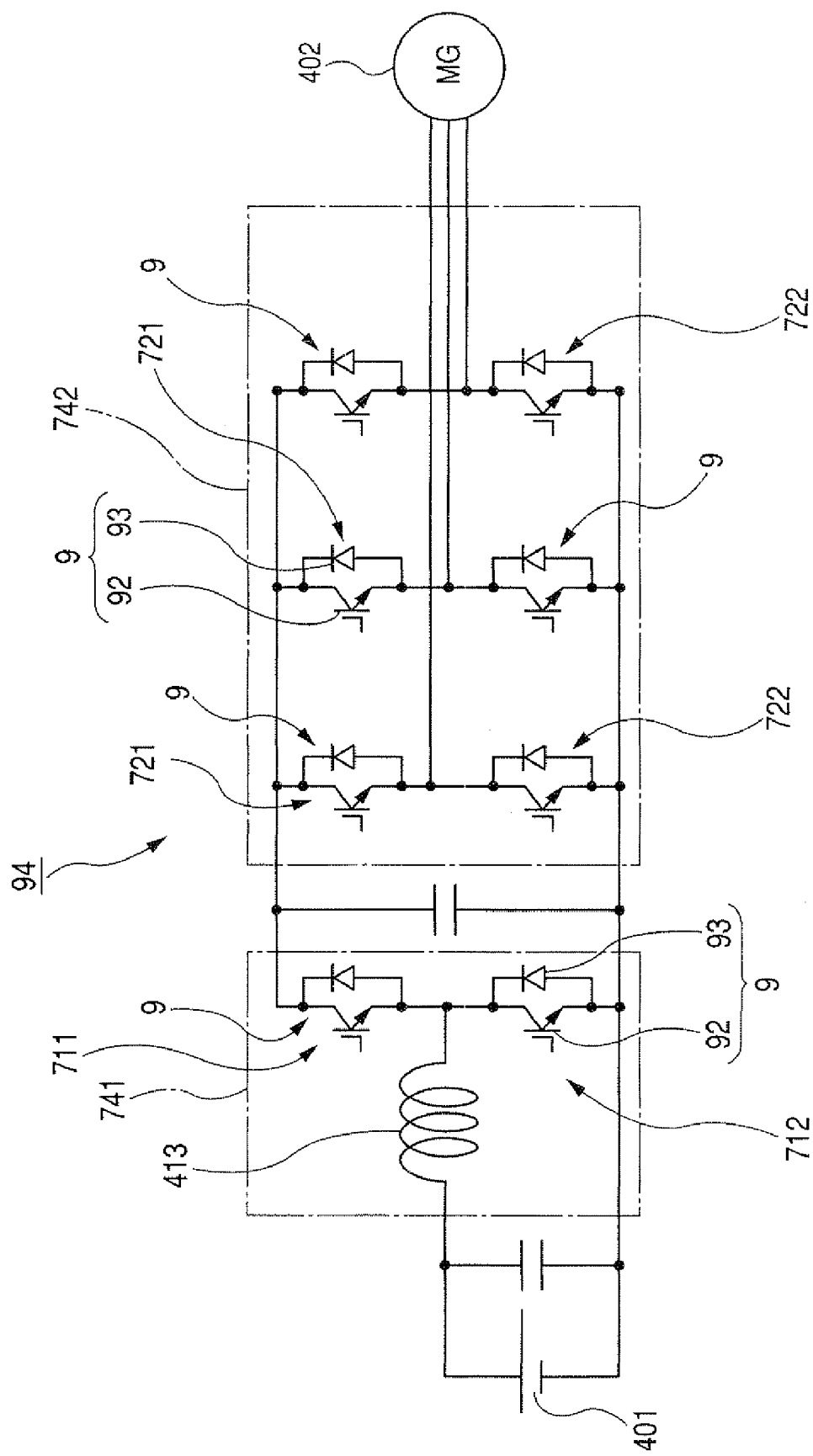
FIG. 7 is a circuit diagram of a conventional electric-power conversion device equipped with a plurality of semiconductor modules.
Figure 8:
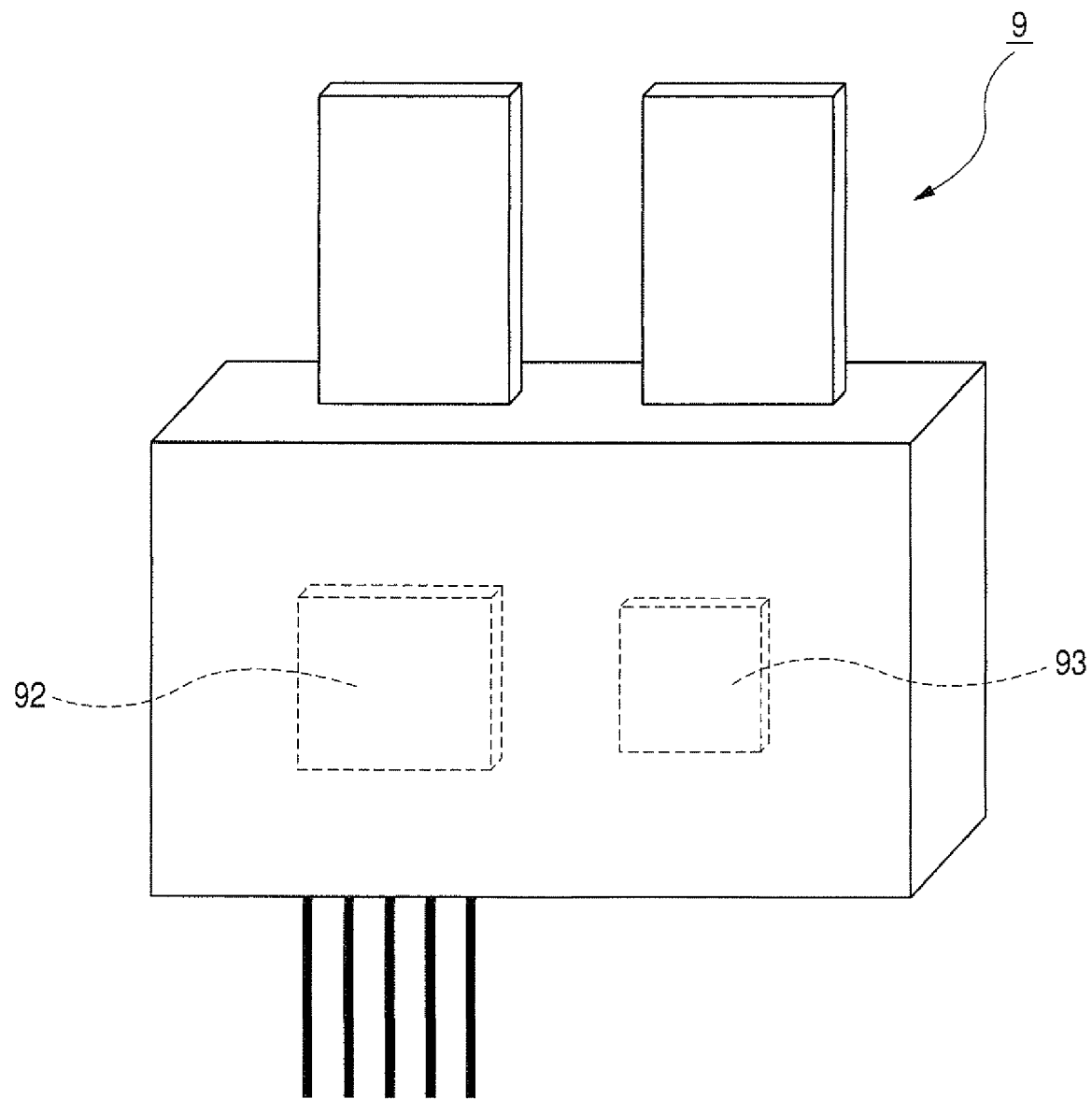
FIG. 8 is a perspective view of a conventional semiconductor module to be built in the conventional electric-power conversion device shown in FIG. 7.
Figure 9:
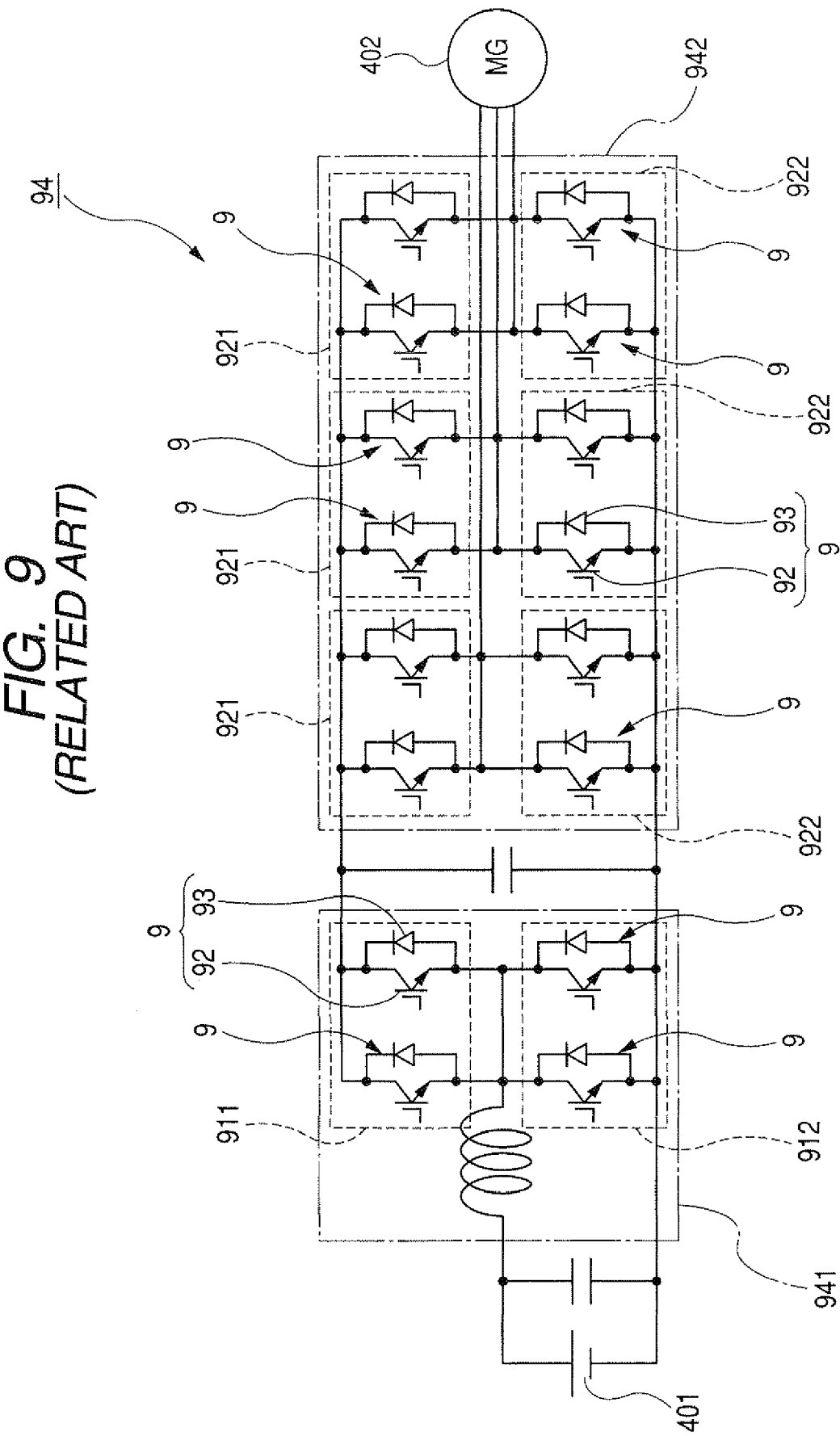
FIG. 9 is a circuit diagram showing another structure of the conventional semiconductor modules to be built in the conventional electric-power conversion device.
Figure 10:
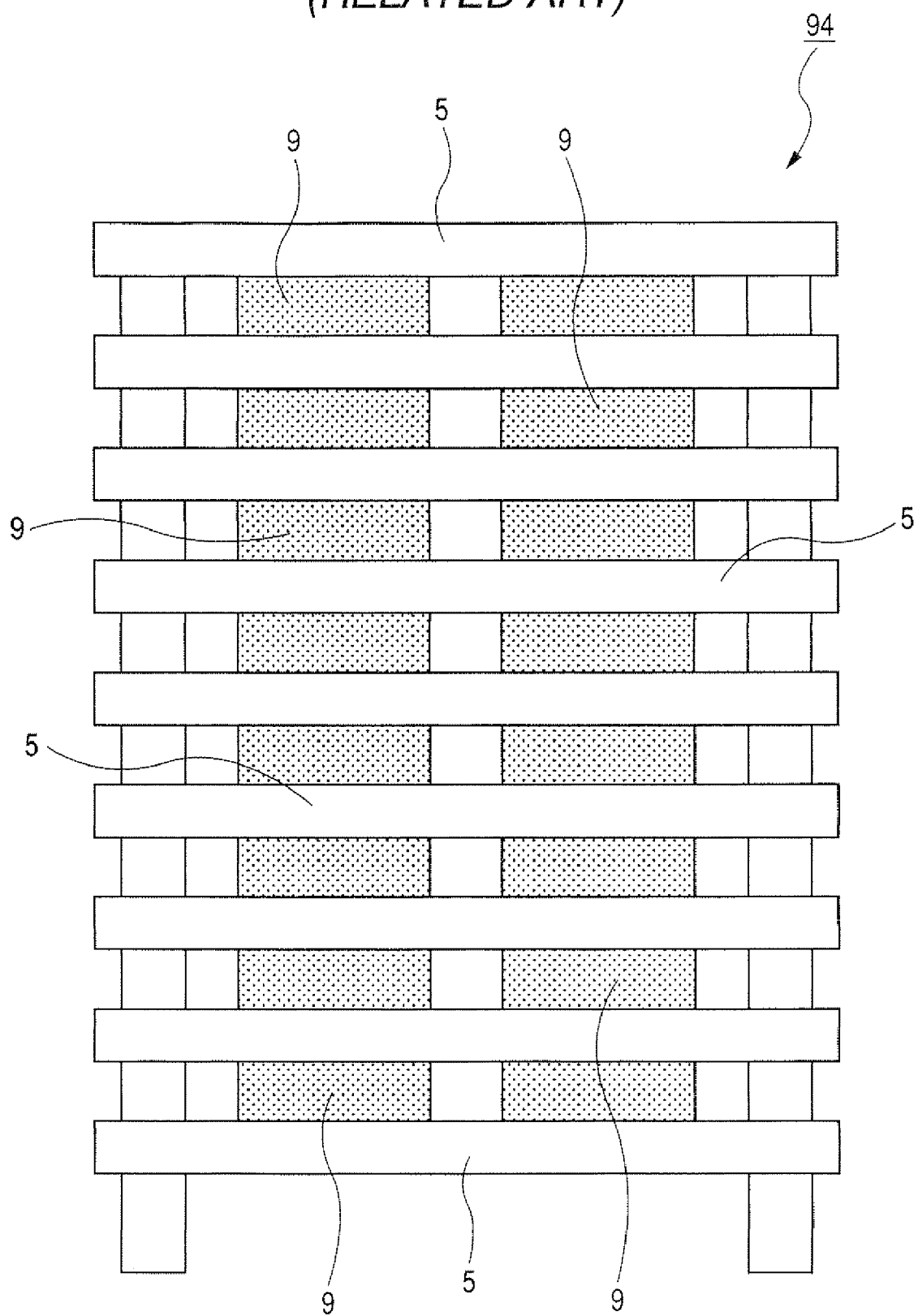
FIG. 10 is a plan view of another structure of the conventional semiconductor modules built in the conventional electric-power conversion device.

FIG. 6 is a perspective view of a semiconductor module as a comparison example. As shown in FIG. 6, the semiconductor module 8 as the comparison example has a different structure of each of the semiconductor modules 1 and 1-1 according to the first and second embodiments of the present invention.

The semiconductor module 8 as the comparison example has an expanded size of each of a switching semiconductor element 82 and a free wheeling semiconductor element 83. That is, it is possible to use the high-power switching semiconductor element 82 and the high-power free wheeling semiconductor element 83 corresponding to a large current to be controlled by the electric-power conversion device. However, adapting the switching semiconductor element 82 and the free wheeling semiconductor elements 83 for increasing a large current to be converted increases its size and also largely decreases the yield rate of a manufacturing ratio of manufacturing the semiconductor modules.

The switching semiconductor element 82 and the free wheeling semiconductor elements 83 generate a large amount of heat. This makes it difficult to suppress the increasing of the temperature rise of the switching semiconductor element 82, in particular, during the power running operation.

On the other hand, the present invention provides the semiconductor modules 1 and 1-1 with a small size, as described in the first and second embodiments. Each semiconductor module is equipped with a plurality of the switching semiconductor elements 2, in particular, which are placed at both the end parts of the arrangement of the switching semiconductor elements 2 and the free wheeling semiconductor element 3. This structure of each of the semiconductor modules 1 and 1-1 increases the heat radiating function and reduces its size.

(Other Features and Effects of the Present Invention)

In the semiconductor module according to the present invention, it is possible to use an insulated gate bipolar transistor (IGBT) as each switching semiconductor element, and to use a free wheeling diode (FWD) as each free wheeling semiconductor element.

It is preferable that the number of the switching semiconductor elements is two. In this structure, each switching semiconductor element is placed at both end parts of the arrangement of the semiconductor elements.

It is thereby possible to enhance the radiating capability of the semiconductor module.

Further, it is preferable that the number of the free wheeling semiconductor elements is one. This structure can reduce the entire size of the semiconductor module.

Still further, it is preferable that the semiconductor module further has a main body part of a rectangle shape which accommodates the switching semiconductor elements and the free wheeling semiconductor element. In the semiconductor module, a longitudinal side of each of the switching semiconductor elements and the free wheeling semiconductor element is arranged in parallel to a short side of the main body part of the rectangle shape. This structure of the semiconductor module can reduce the longitudinal length of the semiconductor module, and thereby reduces the entire size of the semiconductor module.

Still further, it is preferable for the semiconductor module to have a plurality of the free wheeling semiconductor elements. This structure can suppress the temperature rise of the free wheeling semiconductor elements, and can improve the radiating capability of the semiconductor module.

Still further, it is preferable for the semiconductor module to further have a main body part of a rectangle shape which accommodates the switching semiconductor elements and the free wheeling semiconductor elements. In the semiconductor module, a longitudinal side of each of the switching semiconductor elements is arranged in parallel to a short side of the main body part of the rectangle shape. The free wheeling semiconductor elements are arranged in parallel to the direction of the short side of the main body part of the rectangle shape. This structure can reduce the longitudinal size of the semiconductor module, and as a result, reduce the entire size of the semiconductor module.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. A semiconductor module comprising:
two switching semiconductor elements arranged in parallel to each other;
a single free wheeling semiconductor element arranged between the switching semiconductor elements so that the switching semiconductor elements are placed at both end parts of the arrangement of the free wheeling semiconductor element and the switching semiconductor element, and the free wheel semiconductor element is reversely arranged in parallel to the switching semiconductor elements;
a main body part of a rectangle shape which accommodates the switching semiconductor elements and the free wheeling semiconductor element;
a pair of a first radiating plate and a second radiating plate, with which the switching semiconductor elements and the free wheel semiconductor element are supported between the first radiating plate and the second radiating plate;
spacers placed on one surface side of the switching semiconductor elements and the free wheeling semiconductor element;
a pair of electrode terminals extending from one longitudinal side of the main body part and electrically connected to the pair of the first radiating plate and the second radiating plate; and
signal terminals extending from the other longitudinal side of the main body and electrically connected to a control circuit substrate capable of controlling the switching semiconductor elements,
wherein a longitudinal side of each of the switching semiconductor elements and the free wheeling semiconductor element is arranged in parallel to a short side of the main body part,
each of the switching semiconductor elements and the free wheeling semiconductor element is placed between the first radiating plate and the second radiating plate through the corresponding spacer,
the main body part accommodating the switching semiconductor elements and the free wheeling semiconductor element is molded by resin, and
the direction in arrangement of the switching semiconductor elements and the free wheeling semiconductor element is perpendicular to a stacked direction of the radiating plates, the spacers, the switching semiconductor elements, and the free wheeling semiconductor element, perpendicular to a direction to which the electrode terminals are extended from one longitudinal side of the main body part, and perpendicular to a direction to which the signal terminals are extended from the other longitudinal side of the main body part.

2. A semiconductor module comprising:
two switching semiconductor elements arranged in parallel to each other;
two free wheeling semiconductor elements arranged between the switching semiconductor elements so that the switching semiconductor elements are placed at both end parts of the arrangement of the free wheeling semiconductor elements and the switching semiconductor element, and each of the free wheel semiconductor elements is reversely arranged in parallel to the switching semiconductor elements;
a main body part of a rectangle shape which accommodates the switching semiconductor elements and the free wheeling semiconductor element;
a pair of a first radiating plate and a second radiating plate, with which the switching semiconductor elements and the free wheel semiconductor elements are supported between the first radiating plate and the second radiating plate;
spacers placed on one surface side of the switching semiconductor elements and the free wheeling semiconductor element;
a pair of electrode terminals extending from one longitudinal side of the main body part and electrically connected to the pair of the first radiating plate and the second radiating plate; and
signal terminals extending from the other longitudinal side of the main body and electrically connected to a control circuit substrate capable of controlling the switching semiconductor elements,
wherein a longitudinal side of each of the switching semiconductor elements and the free wheeling semiconductor element is arranged in parallel to a short side of the main body part, each of the switching semiconductor elements and the free wheeling semiconductor elements is placed between the first radiating plate and the second radiating plate through the corresponding spacer, the main body part accommodating the switching semiconductor elements and the free wheeling semiconductor elements is molded by resin, and the direction in arrangement of the switching semiconductor elements and the free wheeling semiconductor elements is perpendicular to a stacked direction of the radiating plates, the spacers, the switching semiconductor elements, and the free wheeling semiconductor elements, perpendicular to a direction to which the electrode terminals are extended from one longitudinal side of the main body part, and perpendicular to a direction to which the signal terminals are extended from the other longitudinal side of the main body part.

* * * * *